United States Patent [19]

Yamamoto

[11] Patent Number: 5,021,323

[45] Date of Patent: Jun. 4, 1991

[54] LIGHT-SENSITIVE MATERIAL CONTAINING SILVER HALIDE, REDUCING AGENT AND POLYMERIZABLE COMPOUND

[75] Inventor: Soichiro Yamamoto, Kanagawa, Japan

[73] Assignee: Fuji Photo Film Co., Ltd., Kanagawa, Japan

[21] Appl. No.: 496,156

[22] Filed: Mar. 19, 1990

Related U.S. Application Data

[63] Continuation of Ser. No. 218,180, Sep. 15, 1988, abandoned, which is a continuation-in-part of Ser. No. 12,462, Feb. 9, 1987, abandoned.

[30] Foreign Application Priority Data

Feb. 7, 1986 [JP] Japan .................................. 61-25576

[51] Int. Cl.$^5$ ................................................ G03C 5/00
[52] U.S. Cl. ..................................... 430/292; 430/138; 430/204; 430/281; 430/434; 430/495; 430/567
[58] Field of Search ............... 430/138, 204, 281, 292, 430/434, 495, 567

[56] References Cited

U.S. PATENT DOCUMENTS

| | | | |
|---|---|---|---|
| 3,687,667 | 8/1972 | Hayakawa et al. | 430/281 |
| 3,694,253 | 3/1972 | Gerber et al. | 430/138 |
| 4,287,290 | 9/1981 | Mizuno et al. | 430/204 |
| 4,419,442 | 12/1983 | Falxa et al. | 430/567 |
| 4,433,048 | 2/1984 | Solberg et al. | 430/503 |
| 4,439,520 | 3/1984 | Kofron et al. | 430/502 |
| 4,560,637 | 12/1985 | Maeda et al. | 430/478 |
| 4,624,910 | 11/1986 | Takeda | 430/330 |

*Primary Examiner*—Jack P. Brammer
*Attorney, Agent, or Firm*—Sughrue, Mion, Zinn, Macpeak & Seas

[57] ABSTRACT

A light-sensitive material comprises a support and a light-sensitive layer which contains a reducing agent, an ethylenic unsaturated polymerizable compound and silver halide grains having a halogen composition composed of two or more halogens including iodine. The silver halide grains have a core/shell structure, and at least 50% of the silver halide grains have an aspect ratio of not more than 5. The silver iodide content in the shell is higher than that in the core. An image-forming method utilizing the light-sensitive material is also disclosed.

16 Claims, No Drawings

LIGHT-SENSITIVE MATERIAL CONTAINING SILVER HALIDE, REDUCING AGENT AND POLYMERIZABLE COMPOUND

CROSS-REFERENCE TO RELATED APPLICATION

This is a continuation of application Ser. No. 07/218,180 filed Sept. 15, 1988, now abandoned, which is a continuation-in-part application of U.S. patent application Ser. No. 07/012,462 filed on Feb. 9, 1987, now abandoned.

FIELD OF THE INVENTION

This invention relates to a light-sensitive material comprising a light-sensitive layer containing silver halide, a reducing agent and a polymerizable compound provided on a support, and further relates to an image-forming method employing the light-sensitive material.

BACKGROUND OF THE INVENTION

A light-sensitive material which comprises a support and a light-sensitive layer containing silver halide, a reducing agent and a polymerizable compound can be used in an image forming method in which a latent image of silver halide is formed, and then the polymerizable compound is polymerized to form the corresponding image.

Examples of said image forming methods are described in Japanese Patent Publication Nos. 45(1970)-11149 (corresponding to U.S. Pat. No. 3,697,275), 47(1972)-20741 (corresponding to U.S. Pat. No. 3,687,667) and 49(1974) -10697. and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore the process takes a relatively long time.

An improved image forming method employing a dry process is described in Japanese Patent Provisional Publication Nos. 61(1986)-69062 and 61(1986)-73145 (the contents of both publications are described in U.S. Pat. No. 4,629,676 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441 (the content of the three publications are shown in U.S. patent application Ser. No. 827,702).

The above-mentioned image forming methods are based on the principle in which the polymerizable compound is polymerized within the area where a latent image of the silver halide has been formed.

Further, Japanese Patent Provisional Publication No. 61(1986)-260241 (corresponding to U.S. patent application Ser. No. 854,640) describes another image forming method in which the polymerizable compound within the area where a latent image of the silver halide has not been formed is polymerized. In this method, when the material is heated, the reducing agent functions as polymerization inhibitor within the area where a latent image of the silver halide has been formed, and the polymerizable compound in the other area is polymerized.

SUMMARY OF THE INVENTION

An object of the present invention is to provide a light-sensitive material (or element) which gives a clear image.

There is provided by the present invention a light-sensitive element comprising a support and a light-sensitive layer which contains silver halide grains, a reducing agent and an ethylenic unsaturated polymerizable compound, said silver halide grains being contained in such amount that the total silver content in the light-sensitive layer is in the range of from 0.1 mg/m$^2$ to 10 g/m$^2$, said reducing agent being contained in the range of from 0.1 to 1,500 mole % based on the total silver content in the light-sensitive layer, and said polymerizable compound being contained in the range of from 5 to 120,000 times by weight as much as the amount of the silver halide grains, wherein the silver halide grains have a mean grain size of 0.001 to 5 $\mu$m and at least 50% of number of the silver halide grains have an aspect ratio of not more than 5 and have such a core/shell structure that the shell portion contains iodine at a concentration higher than that in the core portion, the iodine concentration in the shell portion is not less than 10 mole % of the halogen content therein, and the shell portion contains silver in an amount of 0.01 to 50 weight % of the silver in the silver halide grains.

The light-sensitive material of the invention can be advantageously used in a process which comprises the steps of:

- imagewise exposing to light the light-sensitive element to form a latent image of the silver halide; and
- heating the light-sensitive element either simultaneously with or after the imagewise exposure to polymerize the polymerizable compound within the area where the latent image of the silver halide has been formed (or the area where the latent image of the silver halide has not been formed).

The light-sensitive material of the invention is characterized in that at least 50% of number of the silver halide grains have an aspect ratio of not more than 5 and have such a core/shell structure that the iodine concentratin in the shell portion is higher than that in the core portion.

The present inventor has found that the light-sensitive material employing the above-mentioned silver halide grains is reduced in the occurrence of fog and accelerated in the development. Therefore, the light-sensitive material of the invention can form a clear image having a high maximum density and a low minimum density.

DETAILED DESCRIPTION OF THE INVENTION

The silver halide grains in the present invention have a halogen composition composed of two or more halogens including iodine. For instance, silver chloroiodide, silver iodobromide or silver chloroiodobromide grain is employed in the invention. The silver halide grain consists essentialy of silver halide. In more detail, at least 90 weight % (more preferably 95 weight %, and most preferably 99 weight %) of the silver halide grain comprises the above-mentioned two or more kinds of the silver halide.

Further, at least 50% of number of the silver halide grains have an aspect ratio of not more than 5. According to study of the present inventor, the silver halide grains having an aspect ratio of not more than 5 (non-tabular grains) are preferably used in the above-mentioned light-sensitive material. The process for preparation of the light-sensitive material is much more complicated than that of the conventional silver halide photographic material. Accordingly, tabular grains having an aspect ratio of more than 5 should be carefully used in the process for preparation of the light-sensitive material, since the tabular grains are fragile. Further, in the case that the light-sensitive material employs microcapsules, it is difficult to incorporate the tabular silver halide grains into the microcapsules (especially, into the shell of the microcapsules).

The aspect ratio of the silver halide grains means tha ratio of the grain size (diameter), namely the ratio of the tabular plane to the thickness. The grains size means the diameter of the circle having the same area as the projected area of the grain on the tabular plane. It is more preferred that at least 70% of the silver halide grains have an aspect ratio of not more than 5. It is also preferred that the silver halide grains have an average aspect ratio of not more than 5. Each of the above proportions, "50%" and "70%" means the proportion of of the total projected area of the non-tabular grains having an aspect ratio of not more than 5 to that of all of the grains.

There is no specific limitation on the crystal habit of the silver halide grain, except that at least 50% of the silver halide grains have an aspect ratio of not more than 5. Accordingly, ususal silver halide grains, such as cubic grains and octahedral grains may be used in the present invention. Further, it is preferred that at least 50% of number of the silver halide grains has an "aspect ratio" of not more than 5 with respect to not only thickness but also various directions.

Furthermore, the silver halide grain in the invention has a core/shell structure. In the present specification, "core/shell structure" means a structure in which the halogen composition in the silver halide grain is not uniform from the center to the surface of the grain.

Example of the silver halide grain having the core/shell structure is a grain having a multilayer structure formed in the grain formation, which is described in Japanese Patent Provisional Publication Nos. 57(1982)-154232, 58(1983)-108533, 59(1984)-48755 and 59(1984)-52237, U.S. Pat. No. 4,433,048 and European Patent No. 100,984. Another example of the silver halide grain is a grain having a multilayer structure formed by adding a different halogen ion to a silver halide grain having a uniform halogen composition to convert the surface halogen composition of the grain, which is described in Japanese Patent Provisional Publication No. 52(1977)-18309 and U.S. Pat. Nos. 3,622,318 and 3,703,584.

The multilayer structure of the grain generally is a double layer structure. In the case that the silver halide grain has the double layer structure, the outer part is referred to as "shell", and the inner part is referred to as "core" in the specification.

The silver halide grain can have a triple or more layer structure. In this case, the outermost layer is referred to as "shell", and all of other portions are referred to as "core".

The shell portion contains silver in an amount of 0.01 to 50 weight % of the silver in the silver halide grains. The shell preferably contains silver in an amount of 0.1 to 50 weight %.

Further, the silver halide grain can have a structure in which the halogen composition continuously changes from the center to the surface of the grain, in addition to the multilayer structure. In this case, the outer portion in which 50 wt. % of silver is present is referred to as "shell", and the other inner portion is referred to as "core".

In these core/shell structures, the iodine content (concentration) in the shell is higher than that in the core in the present invention. The iodine content in the shell is preferably at least 2 mole % (more preferably 10 mole %) higher than that in the core.

There is no specific limitation with respect to the other halogen contents (i.e. the chlorine content and the bromine content). Generally, the bromine content is preferably higher than the chlorine content to more reduce the occurrence of fog.

The iodide content (per the total halogen) in the shell is not less than 10 mole % (preferably not less than 30 mole %). The silver iodide content in the whole silver halide grain preferably is not more than 50 mole %.

Two or more kinds of silver halide grains which differ in crystal habit, grain size, and/or other features from each other can be used in combination.

The silver halide grains have a mean grain (or particle) size of 0.001 to 5 $\mu$m, more preferably 0.001 to 2 $\mu$m, most preferably 0.01 to 0.5 $\mu$m.

The total silver content (including silver halide and an organic silver salt which is one of optional components) in the light-sensitive layer is in the range of from 0.1 mg/m$^2$ to 10 g/m$^2$. The silver content of the silver halide in the light-sensitive layer preferably is not more than 1 g/m$^2$, more preferably in the range of from 1 mg to 500 mg/m$^2$.

The silver halide grain can be prepared, for instance by the following process.

The silver halide grain is preferably prepared in the form of a silver halide emulsion. Various processes for the preparation of the silver halide emulsion are known in the conventional technology for the preparation of photographic materials.

The silver halide grain having the core/shell structure can be formed by growing a different silver halide on a silver halide grain having a uniform halogen composition to coat the grain with the different silver halide. The silver halide grain having the core/shell structure can be also formed by adding a different halogen ion to a silver halide grain having a uniform halogen composition to modify the surface halogen composition of the grain. These processes can be repeated to form a triple or more layer structure.

In thess processes, the relation between the halogen compositions in the core and the shell is adjusted to form a silver halide grain in which the silver iodide content in the shell is higher than that in the core.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1982)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of overcoming high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added during the preparation of the emulsion as described in Japanese Patent Application No. 60(1986)-139746.

The reducing agent, the polymerizable compound and the support which constitute the light-sensitive material of the invention with the silver halide grains are described below. Thus composed material is referred hereinafter to as "light-sensitive material".

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound in either the area where a latent image of the silver halide has been formed or the area where a latent image of the silver halide has not been formed can be polymerized. For example, when a hydrazine derivative is used as the reducing agent, the polymerizable compound is polymerized within the area where the latent image has been formed. In the other developing system, in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent or hydrazine derivative) are described in Japanese Patent Provisional Publication Nos. 61(1986)-183640, 61(1986)-188535 and 61(1986)-228441, and Japanese Patent Application Nos. 60(1985)-210657, 60(1985)-226084, 60(1985)-227527 and 60(1985)-227528. These reducing agents are also described in T. James, "The Theory of the Photographic Process", 4th edition, 291-334 (1977), Research Disclosure No. 17029, 9-15 (June 1978). and Research Disclosure No. 17643, 22-31 (December 1978). The reducing agents described in the these publications and applications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)-hydrazine, 1-lauroyl-2-(p- or o-aminophenyl)hydrazine, 1-trityl-2-(2,6-dichloro-4-cyanophenyl)hydrazine, 1-trityl-2phenylhydrazine. 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)butyloyl-2-(p- or o-aminophenyl)-hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}-phenyl]hydrazine, 1-{4-(2,5-di-tert-pentylphenoxy)butyloyl}-2-(p- or o- methoxyphenyl)hydrazine, 1-(methoxycarbonylbenzohydryl)-2-phenylhydrazine, 1-formyl-2-[4 -{2-(2,4-di-tert-pentylphenoxy)-butylamid}phenyl]hydrazine, 1-acetyl-2-[4-{2-(2,4-di-tert-pentylphenoxy)butylamido}phenyl]hydrazine, 1-trityl-2-[{2.0-dichloro-4-(N,N-di-2-ethylhexyl)carbamoyl}phenyl]hydrazine, 1-(methoxycarbonylbenzohydryl)-2-(2,4-dichlorophenyl)hydrazine and 1-trityl-2-[(2-(N-ethyl-N-octylsulfamoyl)-4-methanesulfonyl}phenyl]hyrazine.

The amount of the reducing agent in the light-sensitive layer ranges from 0.1 to 1,500 mole % based on the amount of silver (contained in the above-mentioned silver halide and an organic silver salt).

There is no specific limitation with respect to the polymerizable compound, except that the polymerizable compound has an ethylenic unsaturated group. Any known ethylenic unsaturated polymerizable compounds including monomers, oligomers and polymers can be contained in the light-sensitive layer. In the case that heat development (i.e., thermal development) is utilized for developing the light-sensitive material, the polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer ranges from 5 to $1.2 \times 10^5$ times (by weight) as much as the amount of silver halide, more preferably from 10 to $1 \times 10^4$ times as much as the silver halide.

The light-sensitive material of the invention can be prepared by arranging a light-sensitive layer containing the above-mentioned components on a support. There is no limitation with respect to the support. In the case that heat development is utilized in the use of the light-sensitive material, the material of the support preferably is resistant to heat given in the processing stage. Examples of the material employable for the preparation of the support include glass, paper, fine paper, coat paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene).

Various embodiments of the light-sensitive materials, optional components which may be contained in the light-sensitive layer, and auxiliary layers which may be optionally arranged on the light-sensitive materials are described below.

The polymerizable compound is preferably dispersed in the form of oil droplets in the light-sensitive layer. A light-sensitive material in which the polymerizable compound is dispersed in the form of oil droplets is described in Japanese Patent Application No. 60(1985)-218603. Other components in the light-sensitive layer, such as silver halide, the reducing agent, the color image forming substances may be also contained in the oil droplets. A light-sensitive material in which silver halide is contained in the oil droplets is described in Japanese Patent Application No. 60(1985)-261888.

The oil droplets of the polymerizable compound ar preferably prepared in the form of microcapsules. There is no specific limitation on preparation of the microcapsules. The light-sensitive material in which the oil droplets are present in the form of a microcapsule is described in Japanese Patent Application No. 60(1985)-117089. There is also no specific limitation on shell material of the microcapsule, and various known materials such as polymers which are employed in the conventional microcapsules can be employed as the shell material. It is preferred that at least 70 weight % (more preferably at least 90 weight %) of the silver halide grains are arranged in the shell of the microcapsules or on the inner surface of the shell of the microcapsules. The mean size of the microcapsule preferably ranges from 0.5 to 50 $\mu$m, more preferably 1 to 25 $\mu$m, most preferably 3 to 20 $\mu$m.

The light-sensitive layer can further contain optional components such as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers and binders.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145.

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acidbase reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), 29-58 (pressure-sensitive copying paper), 87-95 (azo-graphy), 118-120 (heat-sensitive color formation by a chemical change) or in MSS. of the seminer promoted by the Society of Kinki Chemical Industry, "The Newest Chemistry of Coloring Matter—Attractive Application and New Development as a Functional Coloring Matter", 26-32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material of the invention. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide.

The sensitizing dye is preferably added during the stage of the preparation of the silver halide emulsion. The light-sensitive material wherein the sensitizing dye has been added during the silver halide grain formation is described in Japanese Patent Application No. 60(1985)-139746. The examples of the sensitizing dye are also described in above Japanese Patent Application No. 60(1985)-139746.

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an $\alpha$-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inoganic silver salt can be added to the light-sensitive layer to obtain the same effect. The light-sensitive material employing an organic silver salt is described in Japanese Patent Application No. 60(1985)-141799 (corresponding to U.S. patent Ser. No. 879,747).

Various image formation accelerators are employable in the light-sensitive material of the invention. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or a image-receiving layer, or a similar function. The image formation accelerators can be classified into inoragnic bases, organic bases, base precursors, oils, surface active agents, hot-melt solvents, and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include quanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

The light-sensitive material employing base or base precursor is described in Japanese Patent Application No. 60(1985)-227528.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure 26-28 (December 1976). The light-sensitive material employing the hot-melt solvents is described in Japanese Patent Application No. 60(1985)-227527. The hot-melt solvent is preferably used in an amount of from 0.5 to 50% by weight, and more preferably from 1 to 20% by weight, based on the total solid content of the light-sensitive layer.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", 6-18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tert-butyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound located in a portion where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241 (corresponding to U.S. Ser. No. 854,640).

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters 5 described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are particles which are solid at ambient temperatures. Examples of the antismudging agents include starch particles described in U.K. Patent No. 1,232,347; polymer particles described in U.S. Pat. No. 3,625,736; microcapsule particles containing no color former described in U.K. Patent No. 1,235,991; and cellulose particles, and inorganic particles, such as particles of talc, kaolin, bentonite, agalmatolite, zinc oxide, titanium oxide or almina described in U.S. Pat. No. 2,711,375. Such particles preferably have a mean size of 3 to 50 μm, more preferably 5 to 40 μm. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062.

Examples and usage of the other optional components which can be contained in the light-sensitive layer are also described in the above-mentioned publications and applications concerning the light-sensitive material, and in Research Disclosure Vol. 170, No. 17029, 9–15 (June 1978).

Examples of auxiliary layers which are optionally arranged on the light-sensitive material include an image-receiving layer, a heating layer, an antistatic layer, an anticurl layer and a release layer.

Instead of the use of the image-receiving material, the image-receiving layer can be arranged on the light-sensitive material to produce the desired image on the on the image-receiving layer of the light-sensitive material. The image-receiving layer of the light-sensitive material can be constructed in the same manner as the layer of the image-receiving material. The details of the image-receiving layer will be described later.

The light-sensitive material employing the heating layer is described in Japanese Patent Application No. 60(1985)-135568. Examples and usage of the other auxiliary layers are also described in the above-mentioned publications and applications concerning the light-sensitive material.

The light-sensitive material of the invention can be prepared, for instance, by the following process.

The light-sensitive material is usually prepared by dissolving, emulsifying or dispersing each of the components of the ligt-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

In preparation of the light-sensitive material, the polymerizable compounds are used as the medium for preparation of the liquid composition containing another component of the light-sensitive layer. For example, the silver halide (including the silver halide emulsion), the reducing agent, or the color image forming substance can be dissolved, emulsified or dispersed in the polymerizable compound to prepare the light-sensitive material. Especially, the color image forming substance is preferably incorporated in the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups. —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The polymerizable compound (including the light-sensitive composition) are preferably emulsified in an aqueous medium to prepare the coating solution. The necessary components for preparation of the microcapsule, such as shell material can be incorporated into the emulsion. Further, other components such as the reducing agent can be added to the emulsion.

The emulsion of the polymerizable compound can be processed for forming shell of the microcapsule. Examples of the process for the preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Patent No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; an in situ process utilizing polymerization of monomers as described in U.K. Patent No. 867,797 and U.S. Pat. No. 4,001,140; an electrolytic dispersion and cooling process as described in U.K. Patent Nos. 952,807 and 965,074; a spray-drying process as described in U.S. Pat. No. 3,111,407 and U.K. Patent 930,422; and the like. It is preferable, though not limitative, that the microcapsule is prepared by emulsifying core materials containing the polymerizable compound and forming a polymeric membrane (i.e., shell) over the core materials.

When the emulsion of the polymerizable compound (including the dispersion of the microcapsule) has been prepared by using the light-sensitive composition, the emulsion can be used as the coating solution of the light-sensitive material. The coating solution can be also prepared by mixing the emulsion of the polymerizable compound and the silver halide emulsion.

A light-sensitive material of the invention can be prepared by coating and drying the above-prepared coating solution on a support in the conventional manner.

Use of the light-sensitive material is described below.

In the use of the light-sensitive material of the invention, a development process is conducted simultaneously with or after an imagewise exposure.

Various exposure means can be employed in the image-wise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149. The image forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means in the same manner as the light-sensitive material described in Japanese Patent Application No. 60(1985)-135568. Heating temperatures for the development process usually ranges from 80° C. to 200° C. and preferably from 100° C. to 160° C. Various heating patterns are applicable. The heating time is usually from 1 second to 5 minutes, and preferably from 5 seconds to 1 minute.

During the above development process, a polymerizable compound in a portion where a latent image of the silver halide has been formed or in a portion where a latent image of the silver halide has not been formed is polymerized. In a general system, the polymerizable compound in a portion where the latent image has been formed is polymerized. If a nature or amount of the reducing agent is controlled, the polymerizable compound in a portion where the latent image has not been formed can be polymerized in the same manner as the light-sensitive material described in Japanese Patent Provisional Publication No. 61(1986)-260241 (corresponding to U.S. patent Ser. No. 854,640).

In the above development process, a polymer image can be formed on the light-sensitive layer. A pigment image can be also obtained by fixing pigments to the polymer image.

The image can be also formed on the image-receiving material. The image-receiving material is described hereinbelow. The image forming method employing the image-receiving material or the image-receiving layer is described in Japanese Patent Provisional Publication No. 61(1986)-278849 (corresponding to U.S. patent Ser. No. 868,385).

Examples of the material employable as the support of the image-receiving material include baryta paper in addition to various examples which can be employed as the support of the known light-sensitive material.

The image-receiving material is usually prepared by providing the image-receiving layer on the support. The image-receiving layer can be constructed according to the color formation system. In the cases that a polymer image is formed on the image-receiving material and that a dye or pigment is employed as the color image forming substance, the image-receiving material be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-receiving layer is also employable in the image-receiving layer.

The image-receiving layer can be composed of two or more layers according to the above-mentioned functions. The thickness of the image-receiving layer preferably ranges from 1 to 100 μm, more preferably from 1 to 20 μm.

After the development process, pressing the light-sensitive material in contact with the image-receiving material to transfer the polymerizable compounds which is still polymerizable to the image-receiving material, a polymer image can be obtained in the image-receiving material. The process for pressing can be carried out in various known manners.

In the case that the light-sensitive layer contains a color image forming substance, the color image forming substance is fixed by polymerization of the polymerizable compound. Then, pressing the light-sensitive material in contact with the image-receiving material to transfer the color image forming substance in unfixed portion, a color image can be produced on the image-receiving material.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of silver halide emulsion

In 1,000 ml of water were dissolved 20 g of gelatin and 1 g of potassium bromide, and the resulting gelatin solution was kept at 60° C. To the gelatin solution, 600 ml of an aqueous solution containing 70 g of potassium bromide and 600 ml of an aqueous solution containing 0.59 mole of silver nitrate were added simultaneously at the same feed rate over a period of 40 minutes. Further, after 5 mimutes, to the resulting mixture was added 100 ml of an aqueous solution containing 2 g of potassium iodide to obtain a silver iodobromide emulsion having cubic grains, uniform grain size distribution and a mean grain size of 0.20 μm. All of the silver halide grains have an aspect ratio of not more than 5. The shell was 2% of the silver halide grain based on the silver content. The silver iodide content in the core was 0%, and the silver iodide content in the shell was 100%.

The emulsion was washed for desalting to obtain a silver halide emulsion (a). The yield of the emulsion was 600 g.

Preparation of silver benzotriazole emulsion

In 3,000 ml of water were dissolved 28 g of gelatin and 13.2 g of benzotriazole, and the solution was kept at 40° C. while stirring. To the solution was added 100 ml of an aqueous solution of 17 g of silver nitrate over 2 min. Excessive salts were sedimented and removed from the resulting emulsion by pH-adjustment. Thereafter, the emulsion was adjusted to a pH of 6.30 to obtain a silver benzotriazole emulsion. The yield of the emulsion was 400 g.

Preparation of light-sensitive composition

In 100 g of trimethylolpropane triacrylate were dissolved 0.40 g of the following copolymer, 6.00 g of Pargascript Red I-6-B (produced by Ciba Geigy) and 2 g of Emulex NP-8 (tradename, produced by Nippon Emulsion Co., Ltd.).

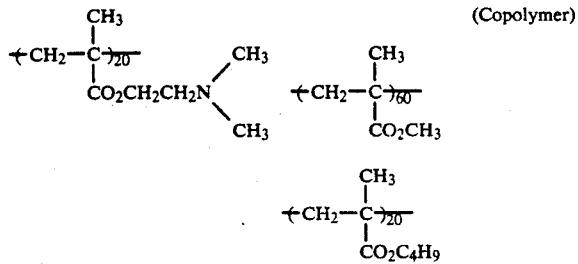
(Copolymer)

To 2 g of the resulting solution was added a solution in which 0.16 g of the following reducing agent (I) and 1.22 g of the following reducing agent (II) are dissolved in 1.80 g of methylene chloride.

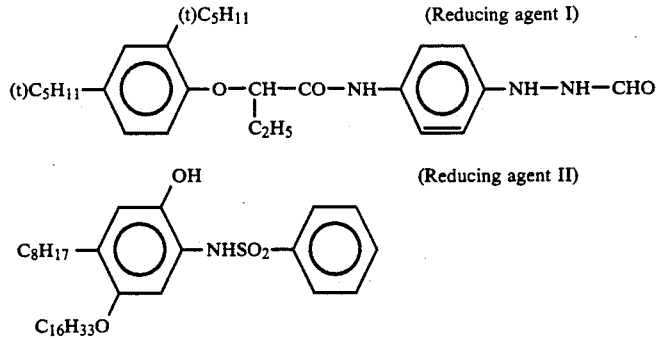

Further, to the resulting solution were added 2 g of the silver halide emulsion and 2 g of the silver benzotriazole emulsion, and the mixture was stirred at 15,000 r.p.m. for 5 min. to obtain a light-sensitive composition.

Preparation of light-sensitive microcapsule

To 10.51 g of 18.6% aqueous solution of Isobam (tradename, produced by Kuraray Co., Ltd.) was added 48.56 g of 2.89% aqueous solution of pectin. After the solution was adjusted to a pH of 4.0 using 10% sulfuric acid, the light-sensitive composition was added to the resulting solution, and the mixture was stirred at 7,000 r.p.m. for 2 min. using a homogenizer to emulsify the light-sensitive composition in the aqueous medium.

To 72.5 g of the aqueous emulsion were added 8.32 g of 40% aqueous solution of urea, 2.82 g of 11.3% aqueous solution of resorcinol, 8.56 g of 37% aqueous solution of formaldehyde, and 2.74 g of 8.76% aqueous solution of ammonium sulfate in this order, and the mixture was heated at 60° C. for 2 hours while stirring. After the mixture was adjusted to a pH of 7.0 using 10% aqueous solution of sodium hydroxide, 3.62 g of 30.9% aqueous solution of sodium hydrogen sulfite was added to the mixture to obtain a dispersion containing light-sensitive microcapsules.

Preparation of light-sensitive material

To 10.0 g of the light-sensitive microcapsule dispersion were added 1.0 g of 1% aqueous solution of the following anionic surfactant and 3.0 g of 10% solution (solvent: water/ethanol=50/50 as volume ratio) of guanidine trichroloacetate to prepare a coating solution.

(Anionic surfactant)

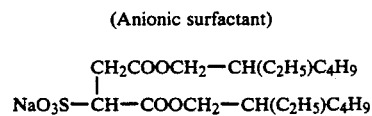

The coating solution was uniformly coated on a polyethyleneterephthalate film (thickness: 100 μm) using a coating rod of #40 to a wet thickness of 70 μm and dried at about 40° C. to obtain a light-sensitive material (A).

EXAMPLE 2

Preparation of silver halide emulsion

The silver emulsion (a) prepared in Example 1 was subjected to chemical sensitization with 5 mg of sodium thiosulfate and 20 mg of 4-hydroxy-6-methyl-1,3,3a,7- tetraazaindenetetraazaindene at 60° C. to obtain a silver halide emulsion (b).

Preparation of light-sensitive material

A light-sensitive material (B) was prepared in the same manner as in Example 1 except that the above silver halide emulsion (b) was used.

COMPARISON EXAMPLE 1

Preparation of silver halide emulsion

In 1,000 ml of water were dissolved 20 g of gelatin and 3 g of sodium bromide, and the resulting gelatin solution was kept at 50° C. To the gelatin solution, 600 ml of an aqueous solution containing 21 g of sodium chloride and S5 g of potassium bromide and 600 ml of an aqueous solution containing 0.59 mole of silver nitrate were added simultaneously at the same feed rate over a period of 20 minutes to obtain a silver chlorobromide emulsion having cubic grains, uniform grain size distribution, a mean grain size of 0.20 μm and a bromide content of 50 mole %. All of the silver halide grains have an aspect ratio of not more than 5.

The emulsion was washed for desalting and then subjected to chemical sensitization with 5 mg of sodium thiosulfate and 20 mg of 4-hydroxy-6-methyl-1,3,3a,7-tetraazaindene at 60° C. to obtain a silver halide emulsion (c). The yield of the emulsion was 600 g.

Preparation of light-sensitive material

A light-sensitive material (C) was prepared in the same manner as in Example 1 except that the above silver halide emulsion (c) was used.

EXAMPLE 3

Preparation of silver halide emulsion

Each of silver halide emulsions (d) to (k) having cubic grains, uniform grain size distribution and a mean grain size of 0.20 μm was prepared in the same manner as in Example 1 except that each of the grain formation was adjusted to the ratio of the shell to the silver halide grain and the silver iodide contents in the core and in the shell set forth in Table 1. All of the silver halide grains contained in each of the silver halide emulsions (d) to (k) have an aspect ratio of not more than 5.

Preparation of light-sensitive material

Light-sensitive materials (D) to (K) were prepared in the same manner as in Example 1 except that the silver halide emulsions (d) to (k) were respectively used.

COMPARISON EXAMPLE 2

Preparation of silver halide emulsion

A silver halide emulsion (1) having cubic grains, uniform grain size distribution and a mean grain size of 0.20 μm was prepared in the same manner as in Example 1 except that the grain formation was adjusted to the ratio of the shell to the silver halide grain and the silver iodide contents in the core and in the shell set forth in Table 1. All of the silver halide grains have an aspect ratio of not more than 5.

Preparation of light-sensitive material

A light-sensitive material (L) was prepared in the same manner as in Example 1 except that the above silver halide emulsions (1) was used.

TABLE 1

| Silver Halide Emulsion | Shell/Silver Halide Grain (Based on Silver Content) | Silver Iodide Content | |
|---|---|---|---|
| | | Core | Shell |
| (a) | 2% | 0% | 100% |
| (d) | 0.01% | 0% | 100% |
| (e) | 0.1% | 0% | 100% |
| (f) | 10% | 0% | 100% |
| (g) | 50% | 0% | 100% |
| (h) | 2% | 0% | 50% |
| (i) | 2% | 0% | 10% |
| (j) | 2% | 10% | 100% |
| (k) | 2% | 10% | 50% |
| (l) | 2% | 50% | 10% |

COMPARISON EXAMPLE 3

Preparation of silver halide emulsion

In 1,000 ml of water were dissolved 20 g of gelatin and 1 g of potassium bromide, and the resulting gelatin solution was kept at 60° C. To the gelatin 600 ml of an aqueous solution containing 70 g of potassium bromide and 600 ml of an aqueous solution 0.5g mole of silver nitrate were added simultaneous the same feed rate over a period of 40 minutes to obtain a silver bromide emulsion having cubic grains, uniform grain size distribution and a mean grain size of 0.20 μm. All of the silver halide grains have an aspect ratio of not more than 5.

The emulsion was washed for desalting to obtain a silver halide emulsion (m). The yield of the emulsion was 600 g.

Preparation of light-sensitive material

A light-sensitive material (M) was prepared in the same manner as in Example 1 except that the above silver halide emulsion (m) was used.

EXAMPLE 4

Preparation of light-sensitive material

A light-sensitive material (N) was prepared in the same manner as in Example 1 except that the silver benzotriazole emulsion was not used.

COMPARISON EXAMPLE 4

Preparation of light-sensitive material

A light-sensitive material (O) was prepared in the same manner as in Example 1 except that the silver halide emulsion (c) prepared in Comparison Example 1 was used and the silver benzotriazole emulsion was not used.

Preparation of image-receiving material

To 125 g of water was added 11 g of 40% aqueous solution of sodium hexametaphosphate, and were further added 34 g of zinc 3,5-di-α-methylbenzylsalicylate and 82 g of 55% slurry of calcium carbonate, followed by coarsely dispersing in a mixer. The coarse dispersion was then finely dispersed in a dynamic dispersing device. To 200 g of the resulting dispersion were added 0 g of 50% latex of SBR (styrene-butadiene rubber) and 55 g of 8% aqueous solution of polyvinyl alcohol, and the resulting mixture was made uniform.

The mixture was then uniformly coated on an art paper having a weight of 43 g/m² to give a layer having a wet thickness of 30 μm and dried to obtain an imagereceiving material.

Evaluation of light-sensitive material

Each of the light-sensitive materials prepared in Examples 1 to 5 and Comparison Examples 1 to 4 was imagewise exposed to light through a filter in which the density continuously changed, using a tungsten lamp at 200 lux for 1 second and then heated on a hot plate at 125° C. for 30 seconds. Each of the exposed and heated light-sensitive materials was then combined with the image-receiving material and passed through press rolls under pressure of 350 kg/cm² to obtain a magenta positive image on the image receiving material. The density of the obtained image was measured using Macbeth reflection densitometer.

The results are set forth in Table 2. In Table 2, "Relative Sensitivity" is referred to a relative value based on the sensitivity (100) of the light-sensitive material (M), and each of "Mimimum Density" and "Maximum Density" is respectively referred to the increase or decrease over the value of the light-sensitive material (M)

TABLE 2

| Light-Sensitive Material | Silver Halide Emulsion | Silver* Benzo-triazole | Relative Sensitivity | Minimum Density | Maximum Density |
|---|---|---|---|---|---|
| (A) | (a) | + | 236 | −0.08 | +0.22 |
| (B) | (b) | + | 270 | −0.11 | +0.15 |
| (C) | (c) | + | 75 | +0.02 | −0.05 |
| (D) | (d) | + | 109 | −0.01 | +0.02 |
| (E) | (e) | + | 169 | −0.05 | +0.10 |
| (F) | (f) | + | 221 | −0.08 | +0.19 |
| (G) | (g) | + | 173 | −0.05 | +0.11 |
| (H) | (h) | + | 210 | −0.07 | +0.17 |
| (I) | (i) | + | 180 | −0.06 | +0.12 |
| (J) | (j) | + | 266 | −0.11 | +0.26 |
| (K) | (k) | + | 203 | −0.07 | +0.16 |
| (L) | (l) | + | 83 | +0.02 | +0.04 |
| (M) | (m) | + | 100 | Standard | Standard |
| (N) | (a) | − | 229 | −0.09 | +0.24 |
| (O) | (c) | − | 68 | +0.02 | −0.01 |

Remark *"Silver Benzotriazole" indicates whether the light-sensitive material contains silver benzotriazole (+) or not (−).

It is apparent from the results in Table 2 that each of the light-sensitive materials (A), (B), and (D) to (K) of the invention forms a clear positive image which has a high maximum density and a low minimum density. It is also apparent that the same effect can be expected regardless of the addition of the silver benzotriazole emulsion (see the line of the material (N) in Table 2), and the material (N) containing no silver benzotriazole emulsion forms a more clear image which has a higher maximum density.

I claim:

1. An image-forming method which comprises the steps of:
   imagewise exposing to light a light-sensitive element comprising a support and a light-sensitive layer which contains silver halide grains, a reducing agent and an ethylenic unsaturated polymerizable compound, said silver halide grains being contained in such amount that the total silver content in the light-sensitive layer is in the range of from 0.1 mg/m² to 10 g/m², said reducing agent being contained in the range of from 0.1 to 1,500 mole % based on the total silver content in the light-sensitive layer, and said polymerizable compound being contained in the range of from 5 to 120,000 times by weight as much as the amount of the silver halide grains; and
   simultaneously or thereafter heating the light-sensitive element at a temperature in the range of 80° C. to 200° C. to imagewise polymerize the polymerizable compound,
   wherein the silver halide grains have a mean grain size of 0.001 to 5 μm and at least 50% of number of the silver halide grains have an aspect ratio of not more than 5 and have such a core/shell structure that the shell portion contains iodine at a concentration higher than that in the core portion, the iodine concentration in the shell portion is not less than 10 mold % of the halogen content therein, and the shell portion contains silver in an amount of 0.01 to 50 weight % of the silver in the silver halide grains.

2. The image-forming method as claimed in claim 1, wherein the polymerizable compound is polymerized within the area where the latent image of the silver halide has been formed.

3. The image-forming method as claimed in claim 1, wherein after heating the light-sensitive element, the light-sensitive element is pressed on an image-receiving element to transfer the obtained image to the image-receiving element.

4. The image-forming method as claimed in claim 1, wherein the light-sensitive element is heated at a temperature in the range of 100° C. to 160° C.

5. The image-forming method as claimed in claim 1, wherein the iodine concentration in the shell portion is not less than 30 mole % of the halogen content therein.

6. The image-forming method as claimed in claim 1, wherein the iodine concentration in the whole silver halide grains is not more than 50 mole % of the halogen content therein.

7. The image-forming method as claimed in claim 1, wherein the shell portion contains silver in an amount of 0.1 to 50 weight % of the silver in the silver halide grains.

8. The image-forming method as claimed in claim 1, wherein the silver halide grains have a mean grain size of 0.01 to 0.5 μm.

9. The image-forming method as claimed in claim 1, wherein at least 70% of number of the silver halide grains have an aspect ratio of not more than 5.

10. The image-forming method as claimed in claim 1, wherein the silver halide grains have an average aspect ratio of not more than 5.

11. The image-forming method as recited in claim 1, wherein the different between the iodine concentration of the shell portion and that in the core potion is larger than 2 mole %.

12. The image-forming method as claimed in claim 1, wherein the different between the iodine concentration of the shell portion and that in the core portion is larger than 10 mole %.

13. The image-forming method as claimed in claim 1, wherein the light-sensitive layer further contains a color image forming substance, said color image forming substance being contained in an amount of from 0.5 to 50 weight % based on the amount of the polymerizable compound.

14. The image-forming method as claimed in claim 1, wherein the silver halide grains and polymerizable compound are contained in microcapsules which are dispersed in the light-sensitive layer.

15. The image-forming method as claimed in claim 1, wherein the silver halide grains and polymerizable compound are contained in microcapsules which are dispersed in the light-sensitive layer, at least 70% of said silver halide grains being arranged in the shell of the microcapsules or on the inner surface of the shell of the microcapsules.

16. The image-forming method as claimed in claim 1, wherein the silver halide grains and polymerizable compound are contained in microcapsules which are dispersed in the light-sensitive layer, and microcapsules having a mean size in the range of from 0.5 to 50 μm.

* * * * *